(12) United States Patent
Hosokawa et al.

(10) Patent No.: US 6,261,685 B1
(45) Date of Patent: Jul. 17, 2001

(54) THERMOSETTING ADHESIVE AND ADHESIVE SHEET THEREOF

(75) Inventors: Kazuhito Hosokawa; Masahiro Oura, both of Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/400,182

(22) Filed: Sep. 21, 1999

(30) Foreign Application Priority Data

Sep. 24, 1998 (JP) .................................................. 10-268856

(51) Int. Cl.$^7$ .......................... C09J 7/02; C09J 133/08; C09J 133/10; C09J 163/00
(52) U.S. Cl. .......................... 428/345; 522/129; 522/182; 525/107; 525/118; 525/119; 428/343; 428/346; 428/355 EP; 428/355 EN; 428/355 AC; 427/207.1; 427/208; 427/208.2
(58) Field of Search .................................... 522/129, 170, 522/182; 525/107, 118, 119; 428/343, 345, 346, 355 EP, 355 EN, 355 AC; 427/207.1, 208, 208.2

(56) References Cited

U.S. PATENT DOCUMENTS

| | | | |
|---|---|---|---|
| 4,883,838 | * 11/1989 | Jung et al. | |
| 5,086,088 | 2/1992 | Kitano et al. | |
| 5,654,387 | * 8/1997 | Bennett et al. | |
| 5,721,289 | * 2/1998 | Karim et al. | |

FOREIGN PATENT DOCUMENTS

| | | |
|---|---|---|
| 3-44592 | 7/1991 | (JP) . |
| 3-45115 | 7/1991 | (JP) . |
| 5-8348 | 1/1993 | (JP) . |
| 7-15090 | 2/1995 | (JP) . |

* cited by examiner

*Primary Examiner*—Susan W. Berman
(74) *Attorney, Agent, or Firm*—Sughrue, Mion, Zinn, Macpeak & Seas, PLLC

(57) ABSTRACT

An adhesive sheet not tacky at ordinary temperatures, exhibiting strong adhesion and high heat resistance by heating under low pressure for a short period of time, having no problem of adhesive protrusion and excellent in storage stability, which comprises a base material having provided on one side or both sides thereof at least one layer of a thermosetting adhesive comprising (1) a non-tacky polymer of a monomer mixture comprising from 70% to 99% by weight of a (meth)acrylic ester represented by formula (I), a homopolymer of which has a glass transition temperature of −30° C. or more, and from 1% to 30% by weight of a monoethylenic unsaturated monomer being copolymerizable therewith and having a functional group capable of reacting with an epoxy resin each based on the monomer mixture and (2) from 5 parts to 30 parts by weight of the epoxy resin per 100 parts by weight of the monomer mixture, and not substantially comprising a curing agent for the epoxy resin:

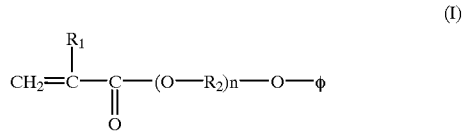

(I)

14 Claims, No Drawings

THERMOSETTING ADHESIVE AND ADHESIVE SHEET THEREOF

FIELD OF THE INVENTION

The present invention relates to a thermosetting adhesive which is excellent in heat resistance and withstands the use thereof at a high temperature of 100° C. or more or in a soldering process, and an adhesive sheet shaped in sheet or tape form comprising a base material having provided thereon the adhesive.

BACKGROUND OF THE INVENTION

Recently, various bonding materials have been used for applications such as fixing of electronic parts. The applications of this kind require not only strong adhesion but also high heat resistance such that the bonding material can withstand solder reflow in mounting an electronic part on a substrate. With miniaturization of electronic equipment, the adhering area has a tendency to become minute. In this case, the control of flowability (protrusion of adhesive) becomes significantly important from the problems of appearance and functional reductions of electronic parts. Further, in the applications of this kind, the adhesion treatment is generally carried out by heat pressing for securing the wettability in adhering, and the adhesion has been desired to be conducted under low pressure for a short period of time for improving the productivity and reducing damage of parts in heat adhering.

To such a request, JP-B-3-44592 (the term "JP-B" as used herein means an "examined Japanese patent publication") and JP-B-7-15090 propose that photopolymerizable compositions prepared by adding epoxy resins and curing agents therefor to photopolymerizable monomers comprising esters of (meth)acrylic acid and alkylene oxide addition products of alcohols or phenols or esters of (meth)acrylic acid and non-tertiary alcohols are irradiated with ultraviolet rays to photopolymerize the above-mentioned photopolymerizable monomers, thereby obtaining thermosetting viscous adhesive compositions.

However, the thermosetting adhesives proposed above are tacky at ordinary temperatures, and bubbles are incorporated therein because of their stickiness in face adhesion by a press. Accordingly, they have the problem that separation and foaming occur at a temperature of 100° C. or more by expansion of the bubbles incorporated. Furthermore, since the adhesives contain imidazole, dicyandiamide or polyamines as the curing agent for the epoxy resin, there is a problem in the storage stability that the curing reaction of the epoxy resin with the curing agent gradually proceeds during storage before or after photo-polymerization to deteriorate the adhesive characteristics.

The curing reaction of the epoxy resin with the curing agent is finally conductedat the time of use for adhesion. Even after this reaction, crosslinkage is not formed between the epoxy resin and the photopolymerized product obtained by photo-polymerization of the photopolymerizable monomers, thereby resulting in insufficient heat resistance. In the thermosetting adhesives proposed above, particularly, the thermosetting adhesive proposed in JP-B-3-44592, the epoxy resin is used in a large amount as the curing component. The unreacted low-molecular weight epoxy resin flows out at the time of heat adhesion by a press to cause adhesive protrusion, which results in disadvantages such as poor appearance.

SUMMARY OF THE INVENTION

Contemplating such a situation, an object of the present invention is to provide a thermosetting adhesive which is not tacky at ordinary temperatures, does not incorporate bubbles in face adhesion to an adherend by a press, can exhibit strong adhesion and high heat resistance by heating under low pressure for a short period of time without the problem of adhesive protrusion, and moreover, is excellent in storage stability.

Another object of the present invention is to provide a sheet-like or tape-like adhesive sheet thereof.

In the course of intensive studies for attaining the above-mentioned objects, the present inventors first studied a photopolymerizable composition obtained by adding a monomer capable of increasing the glass transition temperature of a polymer to be prepared to an alkyl (meth)acrylate containing an alkyl moiety having 2 to 14 carbon atoms on average, which is used generally as the main monomer for an acrylic adhesive sheet, in order to obtain a polymer having reduced tackiness, and further adding an epoxy resin thereto. As a result, an adhesive sheet being not tacky at ordinary temperatures could be prepared, but the adhesion treatment took a very long period of time and the sufficient adhesive characteristics could not be exhibited by heating under low pressure for a short period of time. Then, the present inventors studied a photopolymerizable composition prepared by using an alkyl (meth)acrylate having such an alkyl group that the glass transition temperature of the resulting polymer is −30° C. or more and adding an epoxy resin thereto. The resulting adhesive sheet became very brittle, and those having satisfactory flexibility and softness could not be obtained.

As a result of further studies based on the above-mentioned findings, the present inventors discovered that the use of an acrylic monomer having such a specific structure that the homopolymer has a glass transition temperature of −30° C. or more as the main monomer in place of the above-described alkyl (meth)acrylates, the addition of a monoethylenic unsaturated monomer having functional group(s) for forming crosslinkage with an epoxy resin thereto, the formation of a non-tacky polymer from the resulting monomer mixture by photopolymerization, and the addition of the epoxy resin in a relatively small amount before or after the formation thereof provide a sheet-like product which is excellent in flexibility and softness, which does not incorporate bubbles in face adhesion to an adherend because they does not show the tackiness at ordinary temperatures, which can exhibit strong adhesion and high heat resistance attributable to the curing reaction between the non-tacky polymer and the epoxy resin effected by heating under low pressure for a short period of time without causing adhesive protrusion because of a small amount of the epoxy resin added, and moreover, which has no problem with respect to the storage stability because a usual curing agent such as imidazole, dicyandiamide and polyamines is not incorporated.

That is to say, the present invention provides a thermosetting adhesive comprising (1) a non-tacky polymer of a monomer mixture comprising 70% to 99% by weight of a (meth)acrylic ester represented by the following general formula (I), a homopolymer of which has a glass transition temperature (hereinafter referred to as "Tg") of −30° C. or more, and 1% to 30% by weight of a monoethylenic unsaturated monomer being copolymerizable therewith and having a functional group capable of reacting with an epoxy resin each based on the monomer mixture and (2) 5 parts to 30 parts by weight of an epoxy resin per 100 parts by weight of the monomer mixture, and not substantially comprising a curing agent for the epoxy resin:

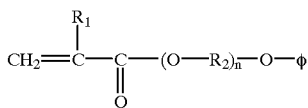

(I)

wherein $R_1$ represents a hydrogen atom or a methyl group; $R_2$ represents a methylene group, an ethylene group or a propylene group; n is an integer of 1 to 3; and φ represents a phenyl group, a monoalkyl-substituted phenyl group or a dialkyl-substituted phenyl group. When φ is a monoalkyl-substituted phenyl group or a dialkyl-substituted phenyl group, the alkyl group as the substituent for the phenyl group generally has from 1 to 5 carbon atoms. When n is 2 or 3, the plural $R_2$ may be the same or different.

Further, the present invention provides the above-mentioned thermosetting adhesive in which the ratio of the epoxy resin is 5 parts to 20 parts by weight per 100 parts by weight of the monomer mixture; the above-mentioned thermosetting adhesive in which the monoethylenic unsaturated monomer having the functional group capable of reacting with the epoxy resin is a carboxyl group-containing monomer or a hydroxyl group-containing monomer; the above-mentioned thermosetting adhesive in which the non-tacky polymer is a polymer obtained by irradiation of a radiation such as an ultraviolet ray; and the above-mentioned thermosetting adhesive in which the irradiation of the radiation such as the ultraviolet ray is conducted in a state where the epoxy resin is mixed with the monomer mixture.

Furthermore, the present invention provides an adhesive sheet shaped in sheet or tape form comprising a base material having provided on one side or both sides thereof the thermosetting adhesive layer or layers having each structure described above.

DETAILED DESCRIPTION OF THE INVENTION

The monomer mixture used in the present invention is a mixture of the (meth)acrylic ester represented by general formula (I) and the monoethylenic unsaturated monomer being copolymerizable therewith and having a functional group capable of reacting with the epoxy resin. The former (meth)acrylic ester may be replaced by a vinyl monomer having no functional groups capable of reacting with the epoxy resin in an amount of 30% by weight or less of the amount allocated for (meth) acrylic ester (70 to 99% by weight of the monomer mixture). Examples of such a vinyl monomer include vinyl acetate, styrene or acrylonitrile, which is known as monomers for modifying general pressure sensitive acrylic adhesives. However, the amount of the vinyl monomer should be determined so as to avoid the production of a tacky polymer which has a reduced glass transition temperature attributable to the vinyl monomer. From the standpoint of the non-tackiness, the resulting polymer preferably has a Tg of −20° C. or more and an elastic modulus (at ordinary temperatures) of $5\times10^6$ dyn/cm$^2$ or more.

The (meth)acrylic esters represented by general formula (I), homopolymers of which have a Tg of −30° C. or higher, and preferably, a Tg of −10° C. or higher, typically include phenoxyethyl (meth)acrylate, phenoxypropyl (meth) acrylate, nonylphenoxyethyl (meth)acrylate and nonylphenoxypropyl (meth) acrylate. Further, esters of ethylene oxide or propylene oxide addition products (having an addition molar number of 3 or less) of phenol, cresol or nonylphenol and (meth)acrylic acid are also preferably used. These esters may be used alone or as a combination of two or more of them.

The monoethylenic unsaturated monomer being copolymerizable therewith and having functional group(s) capable of reacting with the epoxy resin is used for improving the heat resistance and the adhesion by forming crosslinkage between the epoxy resin and the non-tacky polymer produced by copolymerization with the ester. Examples of the monomer include a carboxyl group-containing monomer having a carboxyl group as a functional group capable of reacting with the epoxy group and a hydroxyl group-containing monomer having a hydroxyl group as the functional group. Examples of the carboxyl group-containing monomer include acrylic acid, methacrylic acid and caprolactone-modified acrylates, and examples of the hydroxyl group-containing monomer include 2-hydroxy-3-phenoxypropyl acrylate. These are used either alone or as a combination of two or more of them as required. However, an amino group-containing monomer having an amino group as a functional group capable of reacting with the epoxy group can not be used, because they are too high in reactivity and the resulting adhesive has poor storage stability.

In the monomer mixture, with respect to the amount of the (meth) acrylic ester represented by general formula (I) and the monoethylenic unsaturated monomer being copolymerizable therewith and having a functional group capable of reacting with the epoxy resin, the former (meth)acrylic ester is used in an amount of 70% to 99% by weight, preferably 85% to 95% by weight, and the latter copolymerizable monoethylenic unsaturated monomer is used in an amount of 1% to 30% to by weight, preferably 5% to 15% by weight, each based on the monomer mixture. The heat resistance and the adhesion can be well balanced as the thermosetting adhesives by controlling the amounts as described above.

In the present invention, such a monomer mixture is polymerized to form a non-tacky polymer. In the polymerization, appropriate polymerization processes such as solution polymerization, emulsion polymerization and bulk polymerization can be employed. Of these, bulk polymerization which comprises irradiation of radiation such as ultraviolet rays and electron beams is preferred.

According to this process, there are no fears of corrosion of electronic parts caused by a residual organic solvent, swelling, separation and displacement due to expansion by vaporization at high temperatures, and contamination, poor adhesion and deteriorated moisture resistance caused by bleeding of emulsifiers. Further, the molecular weight of the polymers can be increased by irradiation of ultraviolet rays having a relatively low intensity, and the non-tacky polymer high in the degree of crosslinking, strong in cohesive force and particularly excellent in heat resistance can be obtained. In the polymerization, a thermal polymerization initiator or a photopolymerization initiator can be used, and potassium persulfate, ammoniumpersulfate, hydrogen persulfate or a redox initiator comprising a reducing agent in combination therewith can also be used.

Examples of the thermal polymerization initiator include organic peroxides such as benzoyl peroxide, t-butyl perbenzoate, cumene hydroperoxide, diisopropyl peroxydicarbonate, di-n-propyl peroxydicarbonate, di(2-ethoxyethyl) peroxy-dicarbonate, t-butyl peroxyneodecanoate, t-butyl peroxypivalate, (3,5,5-trimethylhexanoyl) peroxide, dipropionyl peroxide and diacetyl peroxide; and azo compounds such as 2,2'- azobisisobutyronitrile, 2,2'-azobis(2-methylbutyronitrile, 1,1'-azobis(cyclohexane-1-carbonitrile), 2,2'-azobis(2,4-dimethylvaleronitrile), 2,2'-azobis(2,4-dimethyl-4-methoxyvaleronitrile), dimethyl 2,2'-azobis(2-methylpropionate), 4,4'-azobis(4-cyanovaleric acid), 2,2'-azobis(2-hydroxymethylpropionitrile) and 2,2'-azobis[2-(2-imidazoline-2-yl)propane].

The photopolymerization initiators include acetophenone compounds such as 4-(2-hydroxyethoxy)phenyl(2-hydroxy-2-propyl)ketone, α-hydroxy-α, α'-dimethylacetophenone, methoxyacetophenone, 2,2-dimethoxy-2-phenylacetophenone, 2,2-diethoxyacetophenone, 1-hydroxycyclohexyl phenyl ketone and 2-methyl-1-[4-(methylthio)-phenyl]-2-morpholinopropane-1; benzoin ether compounds such as benzoin ethyl ether, benzoin isopropyl ether and anisoin methyl ether; α-ketol compounds such as 2-methyl-2-hydroxypropiophenone; ketal compounds such as benzyl dimethyl ketal; aromatic sulfonyl chloride compounds such as 2-naphthalenesulfonyl chloride; photoactive oxime compounds such as 1-phenone-1, 1-propanedione-2-(o-ethoxycarbonyl)oxime; and benzophenone compounds such as benzophenone, benzoylbenzoic acid, 3,3'-dimethyl-4-methoxybenzophenone and 3,3',4,4'-tetra(t-butylperoxy-carbonyl)benzophenone.

The thermosetting adhesive of the present invention comprises the non-tacky polymer described above and further an epoxy resin as essential ingredients. The epoxy resin may be either mixed after the formation of the non-tacky polymer, or mixed with the monomer mixture before the formation of the non-tacky polymer. In particular, when the monomer mixture is polymerized by irradiation of radiation such as ultraviolet rays, it is desirable that after an epoxy resin is incorporated into the monomer mixture, the monomer mixture is polymerized by irradiation of radiation.

The epoxy resin is a compound containing two or more epoxy groups in a molecule. Examples thereof include bisphenol epoxy resins, aliphatic epoxy resins, ferric epoxy resins and halogenated bisphenol epoxy resins. When the monomer mixture is polymerized by irradiation of radiation after the incorporation of the epoxy resin, an epoxy resin not having any group capable of causing radical polymerization with radiation in a molecule is used.

In the present invention, the amount of the epoxy resin used is from 5 parts to 30 parts by weight, and preferably, from 5 parts to 20 parts by weight, per 100 parts by weight of the monomer mixture, and the optimum amount can be determined within this range depending on the kind of epoxy resin and monomer mixture. If the amount of the epoxy resin is less than 5 parts by weight, the crosslinking reaction of the non-tacky polymer with the epoxy resin does not sufficiently proceed, leading to insufficient heat resistance. On the other hand, if it exceeds 30 parts by weight, an adhesive protrudes at press adhesion to cause abnormal appearance, excessive crosslinking occurs so that a separation phenomenon is liable to occur on the surface of an adhrend, and poor storage stability is caused.

The thermosetting adhesive of the present invention desirably contains known crosslinking agents such as isocyanate compounds and epoxy compounds, for improving the holding characteristics as adhesives. When the photopolymerization is carried out, multifunctional (meth)acrylates such as trimethylolpropane (meth)acrylate, pentaerythritol tetra (meth)acrylate, 1,2-ethylene glycol di (meth)acrylate and 1,6-hexanediol di (meth) acrylate are desirably incorporated.

The amount of the crosslinking agent or multifunctional (meth)acrylate is usually from 0.05 part to 5 parts by weight, and preferably, from 0.1 part to 3 parts by weight, per 100 parts by weight of the monomer mixture. When the multifunctional (meth)acrylate is used, a di-functional (meth) acrylate is preferably used in a larger amount within the above-mentioned range, and a tri-functional or more functional (meth)acrylate is preferably used in a smaller amount within the above-mentioned range. If the above-mentioned amount used is less than 0.05 part by weight, the degree of crosslinking after polymerization can not be sufficiently increased to result in a tendency to deteriorate the holding characteristics. On the other hand, if it exceeds 3 parts by weight, the resulting thermosetting adhesive has an extremely high elasticity, which is liable to cause deterioration of the adhesion such as poor adhesion.

The thermosetting adhesive of the present invention may contain various known additives such as viscosity imparting agents (tackifiers), plasticizers, softeners, fillers, pigments, dyes and antioxidants, as long as they does not deteriorate various characteristic of the adhesives, generally in an amount of 30 parts by weight per 100 parts by weight of the monomer mixture. However, the thermosetting adhesive of the present invention can not contain a general curing agent known as a curing agent for the epoxy resin such as imidazole, dicyandiamide, polyamines and phenol resins. However, as long as crosslinking reaction of a curing agent with an epoxy resin does not substantially proceed before the heat treatment to provide no fear of significantly impairing the storage stability to be improved as one of the objects of the present invention, the adhesive may contain a curing agent. The term "not substantially comprising a curing agent for the epoxy resin" as used in the present invention has such a meaning.

The thermosetting adhesive sheet of the present invention comprises a base material having provided on one side or both sides thereof the thermosetting adhesive layer or layers containing the above-mentioned non-tacky polymer and epoxy resin as essential ingredients, and is shaped in sheet or tape form. The above-mentioned layer or layers can be formed by previously obtaining the non-tacky polymer by an appropriate method, adding the epoxy resin and the crosslinking agent thereto to prepare the thermosetting adhesive, applying the resulting adhesive onto the base material, and optionally conducting crosslinking treatment by heating. More preferred is a process of applying onto the base material a radiation-polymerizable composition obtained by adding the epoxy resin and the multifunctional (meth)acrylate to the monomer mixture or a partially polymerized product thereof before polymerization, irradiating the composition with a radiation such as an ultraviolet ray to polymerize it, and forming a layer simultaneously with the synthesis of the non-tacky polymer. According to this process, better results can be obtained for the heat resistance of the adhesive.

The irradiation of ultraviolet rays is preferably carried out in an oxygen-free atmosphere replaced with an inert gas such as a nitrogen gas, etc., or in a state where the composition is shielded from air by covering with a ultraviolet transmissible film. Ultraviolet rays are electromagnetic radiations having a wavelength range of from about 180 to 460 nm but electromagnetic radiations having wavelengths longer than or shorter than the above wavelength range may be used. As the ultraviolet source, a general ultraviolet irradiation apparatus such as a mercury arc, a carbon arc, a low-pressure mercury lamp, an intermediate-pressure mercury lamp, a high-pressure mercury lamp, a metal halide lamp, etc., is used. The intensity of the ultraviolet rays is properly determined by controlling the distance between the ultraviolet source and a substance to be irradiated or by controlling the voltage in view of the irradiation time (productivity). The irradiation is generally effected such that a rate of polymerization of the composition is 90% or more. The rate of polymerization can be obtained by the following equation: (weight of the resulting polymerized product after heating at 130° C. for 2 hours /weight of the same before heating)×100 (%).

As the base material, not only a non-releasing base material such as fiber base materials and synthetic resin films (e.g., polyester films) but also a releasing base material such as a release paper can be used. In the case of the releasing base material, a thermosetting adhesive layer formed thereon may be finally transferred onto the non-releasing base material. The adhesive sheet of the present invention includes both the sheets using a non-releasing base material and the sheets using a releasing base material as the base material.

The thermosetting adhesive sheet of the present invention is not tacky at ordinary temperatures, does not incorporate bubbles in face adhesion to a substance to be adhered by a press, can exhibit strong adhesion and high heat resistance, particularly, withstanding the use thereof at a high temperature of 100° C. or more or in a soldering process, by the occurrence of the crosslinking reaction of the non-tacky polymer with the epoxy resin by heating under low pressure for a short period of time, without the generation of adhesive protrusion, and moreover, is excellent in storage stability, because there is no fear that the above-mentioned crosslinking reaction proceeds in a state before heating.

The present invention will be illustrated in greater detail with reference to the following examples. All parts are understood to be by weight below.

EXAMPLE 1

In a reaction vessel equipped with a condenser tube, a nitrogen introducing tube, a thermometer and a stirrer, 210 parts of ethyl acetate as a solvent, 95 parts of phenoxyethyl acrylate (the Tg of the homopolymer: −10° C.), 5 parts of acrylic acid and 0.3 part of benzoyl peroxide were placed, and polymerization was conducted in a stream of nitrogen to obtain a solution of a non-tacky polymer having a solid content of about 30% by weight. With the solution, 15 parts of an epoxy resin (trade name: "Epikoat 828", manufactured by Yuka Shell Epoxy Kabushikikaisya) and 1 part of a multifunctional isocyanate crosslinking agent, per 100 parts of the solid content of the solution, were homogeneously mixed to prepare a thermosetting adhesive solution. Then, this thermosetting adhesive solution was applied onto a releasing base material, and dried at 130° C. for 5 minutes to form a thermosetting adhesive layer having a thickness of 100 μm, thereby preparing an adhesive sheet.

EXAMPLE 2

Into a four neck flask, 90 parts of phenoxyethyl acrylate, 5 parts of acryloylmorpholine, 5 parts of acrylic acid and 0.05 part of 2,2-dimethoxy-2-phenylacetophenone were put, and exposed to an ultraviolet ray in an atmosphere of nitrogen to partially conduct photopolymerization, thereby obtaining a syrup having a viscosity of about 30 poises. With 100 parts of this partially polymerized syrup, 15 parts of an epoxy resin (trade name: "Epikoat 828", manufactured by Yuka Shell Epoxy Kabushikikaisya) and 0.3 part of 1,6-hexanediol diacrylate as a crosslinking agent were homogeneously mixed to prepare a photopolymerizable composition. Then, this photo-polymerizable composition was applied onto a releasing base material, and irradiated with an ultraviolet ray of 900 mj/cm$^2$ to conduct photopolymerization, thereby forming a thermosetting adhesive layer having a thickness of 100 μm to prepare an adhesive sheet.

EXAMPLE 3

A photopolymerizable composition was prepared in the same manner as in Example 2 except that 90 parts of an ester (the Tg of the homopolymer: −20° C.) of an ethylene oxide addition product of cresol (the added molar number: 1) and acrylic acid was used in place of 90 parts of phenoxyethyl acrylate, and using the same, a thermosetting adhesive layer having a thickness of 50 μm was formed to prepare an adhesive sheet in the same manner as in Example 2.

EXAMPLE 4

Into a four neck flask, 95 parts of an ester (the Tg of the homopolymer: −25° C.) of an ethylene oxide addition product of nonylphenol (the added molar number: 1) and acrylic acid, 5 parts of 2-hydroxy-3-phenoxypropyl acrylate and 0.05 part of 2,2-dimethoxy-2-phenylacetophenone were put, and exposed to an ultraviolet ray in an atmosphere of nitrogen to partially conduct photopolymerization, thereby obtaining syrup having a viscosity of about 30 poises. With 100 parts of this partially polymerized syrup, 10 parts of an epoxy resin (trade name: "Epikoat 815", manufactured by Yuka Shell Epoxy Kabushikikaisya) and 0.2 part of trimethylolpropane triacrylate as a crosslinking agent were homogeneously mixed to prepare a photopolymerizable composition. Then, this photo-polymerizable composition was applied onto a releasing base material, and irradiated with an ultraviolet ray of 900 mj/cm$^2$ to conduct photopolymerization, thereby forming a thermosetting adhesive layer having a thickness of 100 μm to prepare an adhesive sheet.

COMPARATIVE EXAMPLE 1

In a reaction vessel equipped with a condenser tube, a nitrogen introducing tube, a thermometer and a stirrer, 210 parts of ethyl acetate as a solvent, 60 parts of butyl acrylate (the Tg of the homopolymer: <−30° C.), 35 parts of acrylonitrile, 5 parts of acrylic acid and 0.3 part of benzoyl peroxide were placed, and polymerization was conducted in a stream of nitrogen to obtain a solution of a polymer having a solid content of about 30% by weight. With the solution, 15 parts of an epoxy resin (trade name: "Epikoat 828", manufactured by Yuka Shell Epoxy Kabushikikaisya) and 1 part of a multifunctional isocyanate crosslinking agent, per 100 parts of the solid content of the solution, were homogeneously mixed to prepare an adhesive solution. Then, this adhesive solution was applied onto a releasing base material, and dried at 130° C. for 5 minutes to form an adhesive layer having a thickness of 100 μm, thereby preparing an adhesive sheet.

COMPARATIVE EXAMPLE 2

Into a four neck flask, 80 parts of isooctyl acrylate (the Tg of the homopolymer: <−30° C.), 20 parts of acrylic acid and 0.05 part of 2,2-dimethoxy-2-phenylacetophenone were put, and exposed to an ultraviolet ray in an atmosphere of nitrogen to partially conduct photopolymerization, thereby obtaining syrup having a viscosity of about 30 poises. With 100 parts of this partially polymerized syrup, 10 parts of an epoxy resin (trade name: "Epikoat 828", manufactured by Yuka Shell Epoxy Kabushikikaisya) and 0.3 part of 1,6-hexanediol diacrylate as a crosslinking agent were homogeneously mixed to prepare a photopolymerizable composition. Then, this photo-polymerizable composition was applied onto a releasing base material, and irradiated with an ultraviolet ray of 900 mj/cm$^2$ to conduct photopolymerization, thereby forming an adhesive layer having a thickness of 100 μm to prepare an adhesive sheet.

COMPARATIVE EXAMPLE 3

Into a four neck flask, 80 parts of ethyl acrylate (the Tg of the homopolymer: <−30° C.), 15 parts of acryloylmorpholine, 5 parts of acrylic acid and 0.05 part of 2,2-dimethoxy-2-phenylacetophenone were put, and exposed to an ultraviolet ray in an atmosphere of nitrogen to partially conduct photopolymerization, thereby obtaining a syrup having a viscosity of about 30 poises. With 100 parts of this partially polymerized syrup, 10 parts of an epoxy resin (trade name: "Epikoat 815", manufactured by Yuka Shell Epoxy Kabushikikaisya) and 0.3 part of 1,6-hexanediol diacrylate as a crosslinking agent were homogeneously mixed to prepare a photopolymerizable composition. Then, this photo-polymerizable composition was applied onto a releasing base material, and irradiated with an ultraviolet ray of 900 mj/cm$^2$ to conduct photopolymerization, thereby forming an adhesive layer having a thickness of 80 μm to prepare an adhesive sheet.

COMPARATIVE EXAMPLE 4

A photopolymerizable composition was prepared in the same manner as in Example 2 except that 5 parts of N-vinylpyrrolidone was used in place of 5 parts of acrylic acid and 3 parts of dicyandiamide was added as a curing agent for the epoxy resin, and using the same, a thermosetting adhesive layer having a thickness of 100 μm was formed to prepare an adhesive sheet in the same manner as in Example 2.

COMPARATIVE EXAMPLE 5

Into a four neck flask, 100 parts of phenoxyethyl acrylate and 0.05 part of 2,2-dimethoxy-2-phenylacetophenone were put, and exposed to an ultraviolet ray in an atmosphere of nitrogen to partially conduct photopolymerization, thereby obtaining syrup having a viscosity of about 30 poises. With 100 parts of this partially polymerized syrup, 100 parts of an epoxy resin (trade name: "Epikoat 828", manufactured by Yuka Shell Epoxy Kabushikikaisya), 7 parts of a curing agent ("ACR Hardener X-3615", modified polyamine, manufactured by A. C. R. Co.) and 0.3 part of 1,6-hexanediol diacrylate as a crosslinking agent were homogeneously mixed to prepare a photopolymerizable composition. Then, this photo-polymerizable composition was applied onto a releasing base material, and irradiated with an ultraviolet ray of 900 mj/cm$^2$ to conduct photopolymerization, thereby forming an adhesive layer having a thickness of 100 μm to prepare an adhesive sheet.

For the respective adhesive sheets of Examples 1 to 4 and Comparative Examples 1 to 5, the tackiness, the adhesion (90° peel adhesive strength) and the heat resistance (solder heat resistance) were evaluated by the following methods. Results thereof are as shown in Table 1.

Tackiness

The adhesive sheet cut to a width of 10 mm with the releasing base material included was laminated with SUS 304 (stainless steel specified in Japanese Industrial Standard) by a hand roll at ordinary temperatures, and immediately separated. At that time, one well separated without elongation and breakage was evaluated as "non-tacky", and one in which elongation and breakage were developed was evaluated as "tacky".

Adhesion

The adhesive sheet cut to a width of 10 mm and a length of 50 mm was laminated with a polyimide film having a thickness of 75 μm by a laminator (temperature: 100° C., pressure: 5 kg/cm, speed: 2 m/minute, and then, this laminated product was further laminated with SUS 304 by a press (temperature: 200° C., time: 1 second, pressure: 10 kg/cm$^2$). This sample was cured by heat treatment at 150° C. for 1 hour, followed by standing in the atmosphere of 23° C. and 65% RH for 30 minutes. Then, the adhesive sheet was pulled in the direction of 90° with respect to the surface of SUS 304 at a pulling rate of 50 mm/minute, and its median was taken as the 90° peel adhesive strength.

Heat Resistance

The adhesive sheet cut to a width of 50 mm and a length of 50 mm was laminated with a polyimide film having a thickness of 75 μm by a laminator (temperature: 100° C., pressure: 5 kg/cm, speed: 2 m/minute, and then, this laminated product was further laminated with SUS 304 of a 30 mm square by a press (temperature: 200° C., time: 1 second, pressure: 10 kg/cm$^2$). This sample was cured by heat treatment at 150° C. for 1 hour, followed by treatment for 60 seconds in a state where the sample was floated on a solderbathmeltedat 240° C., directing a SUS 304 face upward.

The laminated state of the sheet after the treatment was visually observed. One in which neither foaming of the adhesive nor abnormal adhesion (floating, wrinkles, displacement and separation) was observed was evaluated as "A", and one in which either the above-mentioned foaming or abnormal adhesion was clearly observed was evaluated as "B".

Adhesive Protrusion

A hole having a diameter of 2 cm was opened at a center of the adhesive sheet cut to a 10 cm square, and pressed at a temperature of 200° C. at a pressure of 10 kgf/cm$^2$ for a press time of 1 second. Then, the maximum value of the length of the adhesive protruded in the hole was measured.

TABLE 1

|  | Tackiness | Adhesion (g/cm) | Heat Resistance | Adhesive Protrusion (mm) |
| --- | --- | --- | --- | --- |
| Example 1 | Non-tacky | 2,500 | A | 0.1 |
| Example 2 | Non-tacky | 4,000 | A | 0.1 |
| Example 3 | Non-tacky | 2,400 | A | 0.1 |
| Example 4 | Non-tacky | 3,200 | A | 0.1 |
| Comparative Example 1 | Non-tacky | 20 | B | 0.1 |
| Comparative Example 2 | Non-tacky | 10 | B | 0.1 |
| Comparative Example 3 | Non-tacky | 50 | B | 0.1 |
| Comparative Example 4 | Non-tacky | 4,000 | B | 0.1 |
| Comparative Example 5 | Tacky | 2,000 | B | 2.0 |

Results of Table 1 described above indicate that the respective adhesive sheets of Examples 1 to 4 are not tacky at ordinary temperatures, do not incorporate bubbles in the face adhesion, give strong adhesion and good solder heat resistance, and show no generation of adhesive protrusion.

In contrast, in Comparative Examples 1 to 3, the adhesive sheets not tacky at ordinary temperatures can be prepared by selecting the copolymerization monomers and the main monomers. However, the adhesive strength and the solder heat resistance can not be sufficiently obtained by the adhesion treatment for a short period of time. In Comparative Examples 4 and 5, the adhesive strength is satisfactory, but the heat resistance is insufficient, because the non-tacky polymers are not crosslinked with the epoxy resins after curing. Further, in Comparative Example 5, the adhesive sheet has the problem that it is tacky at ordinary temperatures because it contains the epoxy resin too much, resulting in a tendency to incorporate bubbles in face adhesion and also in increased adhesive protrusion.

Then, for the respective adhesive sheets of Examples 1 to 4 and Comparative Examples 4 and 5, the adhesion (90° peel adhesive strength) and the heat resistance (solder heat resistance) were examined in the same manners as described above after storage in the atmosphere of 23° C. and 65% RH for 90 days, as storage stability tests. As a result, the respective adhesive sheets of Examples 1 to 4 scarcely changed in both the above-mentioned characteristics. However, the respective adhesive sheets of Comparative Examples 4 and 5 containing the curing agents for the epoxy resins were largely deteriorated in the adhesion (90° peel adhesive strength), to say nothing of the heat resistance (solder heat resistance), so that they could not be used.

As described above, the present invention can provide a thermosetting adhesive and an adhesive sheet thereof comprising (1) a non-tacky polymer obtained by copolymerizing an acrylic monomer having a specific molecular structure, a homopolymer of which has a glass transition temperature of −30° C. or more, with a monoethylenic unsaturated monomer having a functional group capable of reacting with an epoxy resin, and (2) an epoxy resin, as essential ingredients, which is not tacky at ordinary temperatures, does not incorporate bubbles in face adhesion to an adherend, exhibits strong adhesion and high heat resistance, particularly, has excellent heat resistance such that the adhesive can endure the use thereof at a high temperature of 100° C. or more or in a soldering process, by heating under low pressure for a short period of time, scarcely has the problem of the generation of adhesive protrusion in heat adhesion, because the amount of the epoxy resin is relatively small, and further, is excellent in storage stability, because a usual curing agent such as imidazole, dicyandiamide and polyamines is not incorporated.

What is claimed is:

1. A thermosetting adhesive comprising (1) a non-tacky polymer of a monomer mixture comprising from 70% to 99% by weight, based on the weight of the monomer mixture, of a (meth)acrylic ester represented by the following general formula (I), a homopolymer of which has a glass transition temperature of −30° C. or higher, and from 1% to 30% by weight, based on the weight of the monomer mixture, of a monoethylenic unsaturated monomer being copolymerizable therewith and having a functional group capable of reacting with an epoxy resin, and (2) from 5 parts to 30 parts by weight of an epoxy resin per 100 parts by weight of said monomer mixture; and not containing a curing agent for said epoxy resin:

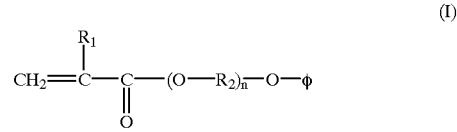

wherein $R_1$ represents a hydrogen atom or a methyl group; $R_2$ represents a methylene group, an ethylene group or a propylene group; n is an integer of 1 to 3; and ø represents a phenyl group, a monoalkyl-substituted phenyl group or a dialkyl-substituted phenyl group.

2. The thermosetting adhesive of claim 1, wherein the amount of the epoxy resin is from 5 parts to 20 parts by weight per 100 parts by weight of the monomer mixture.

3. The thermosetting adhesive of claim 1, wherein the monoethylenic unsaturated monomer having a functional group capable of reacting with the epoxy resin is a carboxyl group-containing monomer or a hydroxyl group-containing monomer.

4. The thermosetting adhesive of claim 1, wherein the non-tacky polymer is a polymer obtained by irradiation of a radiation.

5. The thermosetting adhesive of claim 4, wherein the radiation is an ultraviolet ray.

6. The thermosetting adhesive of claim 4, wherein the irradiation of the radiation is conducted in a state where the epoxy resin is mixed with the monomer mixture.

7. The thermosetting adhesive of claim 6, wherein the radiation is an ultraviolet ray.

8. An adhesive sheet comprising a base material having provided on one side or both sides thereof at least one thermosetting adhesive layer comprising a thermosetting adhesive which comprises (1) a non-tacky polymer of a monomer mixture comprising from 70% to 99% by weight, based on the weight of the monomer mixture, of a (meth) acrylic ester represented by the following general formula (I), a homopolymer of which has a glass transition temperature of −30° C. or higher, and from 1% to 30% by weight, based on the weight of the monomer mixture, of a monoethylenic unsaturated monomer being copolymerizable therewith and having a functional group capable of reacting with an epoxy resin, each based on the monomer mixture and (2) from 5 parts to 30 parts by weight of an epoxy resin per 100 parts by weight of said monomer mixture; and not containing a curing agent for said epoxy resin:

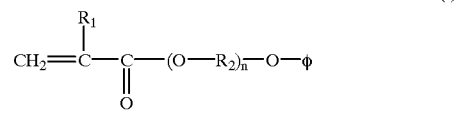

wherein $R_1$ represents a hydrogen atom or a methyl group; $R_2$ represents a methylene group, an ethylene group or a propylene group; n is an integer of 1 to 3; and ø represents a phenyl group, a monoalkyl-substituted phenyl group or a dialkyl-substituted phenyl group.

9. The adhesive sheet of claim 8, wherein the amount of the epoxy resin is from 5 parts to 20 parts by weight per 100 parts by weight of the monomer mixture.

10. The adhesive sheet of claim 8, wherein the monoethylenic unsaturated monomer having a functional group capable of reacting with the epoxy resin is a carboxyl group-containing monomer or a hydroxyl group-containing monomer.

11. The adhesive sheet of claim 8, wherein the non-tacky polymer is a polymer obtained by irradiation of a radiation.

12. The adhesive sheet of claim 11, wherein the radiation is an ultraviolet ray.

13. The adhesive sheet of claim 11, wherein the irradiation of the radiation is conducted in a state where the epoxy resin is mixed with the monomer mixture.

14. The adhesive sheet of claim 13, wherein the radiation is an ultraviolet ray.

* * * * *